(12) United States Patent
McDonald et al.

(10) Patent No.: US 11,977,220 B2
(45) Date of Patent: May 7, 2024

(54) SCULPTED MICROMIRROR IN A DIGITAL MICROMIRROR DEVICE

(71) Applicant: TEXAS INSTRUMENTS INCORPORATED, Dallas, TX (US)

(72) Inventors: William Craig McDonald, Allen, TX (US); James Norman Hall, Parker, TX (US); Terry Alan Bartlett, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 756 days.

(21) Appl. No.: 17/111,309

(22) Filed: Dec. 3, 2020

(65) Prior Publication Data
US 2021/0382296 A1 Dec. 9, 2021

Related U.S. Application Data

(60) Provisional application No. 63/034,297, filed on Jun. 3, 2020.

(51) Int. Cl.
| | |
|---|---|
| *G02B 5/08* | (2006.01) |
| *B81B 3/00* | (2006.01) |
| *B81B 7/00* | (2006.01) |
| *G02B 6/35* | (2006.01) |
| *G02B 26/08* | (2006.01) |

(52) U.S. Cl.
CPC ........ *G02B 26/0833* (2013.01); *B81B 3/0056* (2013.01); *B81B 3/0078* (2013.01); *B81B 3/0086* (2013.01); *B81B 7/0022* (2013.01); *G02B 6/352* (2013.01); *B81B 2201/04* (2013.01); *G02B 5/08* (2013.01); *G02F 2203/12* (2013.01)

(58) Field of Classification Search
CPC ............ G02B 26/0833; G02B 26/0841; G02B 26/352; B81B 3/0056; B81B 3/0078; B81B 3/0086; B81B 2201/04; G02F 2203/12
See application file for complete search history.

(56) References Cited

U.S. PATENT DOCUMENTS

| | | | |
|---|---|---|---|
| 6,028,690 A | 2/2000 | Carter et al. | |
| 2015/0160454 A1* | 6/2015 | Bhakta | G02B 26/0833 362/513 |

* cited by examiner

*Primary Examiner* — Bryan R Perez
(74) *Attorney, Agent, or Firm* — Michelle F. Murray; Frank D. Cimino

(57) ABSTRACT

A digital micromirror device comprises an array of micromirror pixels, the array comprising a first micromirror pixel and a second micromirror pixel. The first micromirror pixel comprises a hinge, where the hinge is configured to tilt toward a first raised address electrode and toward a second raised address electrode. The first micromirror pixel also comprises a first micromirror coupled to the hinge, where the first micromirror has a sculpted edge. The second micromirror pixel comprises a second micromirror, where a first gap between a first point on the sculpted edge and a nearest point to the first point on the second micromirror is larger than a second gap between a second point on the sculpted edge and a nearest point to the second point on the second micromirror.

20 Claims, 11 Drawing Sheets

(12) United States Patent
US 11,977,220 B2

SCULPTED MICROMIRROR IN A DIGITAL MICROMIRROR DEVICE

CROSS-REFERENCE TO RELATED APPLICATIONS

The present application claims priority to U.S. Provisional Patent Application No. 63/034,297, which was filed Jun. 3, 2020, is titled "Sculpted Micro-Mirror," and is hereby incorporated herein by reference in its entirety.

SUMMARY

In accordance with at least one example of the description, a system includes a digital micromirror device (DMD) comprising an array of micromirror pixels, the array comprising a first micromirror pixel and a second micromirror pixel. The first micromirror pixel comprises a hinge, where the hinge is configured to tilt toward a first raised address electrode and toward a second raised address electrode. The first micromirror pixel also comprises a first micromirror coupled to the hinge, where the first micromirror has a sculpted edge. The second micromirror pixel comprises a second micromirror, where a first gap between a first point on the sculpted edge and a nearest point to the first point on the second micromirror is larger than a second gap between a second point on the sculpted edge and a nearest point to the second point on the second micromirror.

In accordance with at least one example of the description, a DMD comprises an array of micromirrors comprising a first micromirror and a second micromirror, where the first micromirror is in a first reset group and the second micromirror is in a second reset group, where the first micromirror has a first sculpted edge, the second micromirror has a second sculpted edge, the first sculpted edge facing the second sculpted edge, where the first sculpted edge and the second sculpted edge are configured to create a first gap and a second gap between the first micromirror and the second micromirror, and where the first gap is larger than the second gap. The DMD also comprises a reset bus, where the reset bus is configured to provide a micromirror clocking pulse to the first reset group, and where the first gap is configured to prevent the first sculpted edge from contacting the second sculpted edge due to a potential difference caused by the micromirror clocking pulse.

In accordance with at least one example of the description, a method comprises storing data in a complementary metal-oxide-semiconductor (CMOS) memory cell coupled to a micromirror pixel in a digital micromirror device (DMD), where the micromirror pixel comprises a first micromirror. The method also comprises receiving a micromirror clocking pulse at the first micromirror via a reset bus, where the first micromirror has a first sculpted edge. The method also comprises landing the first micromirror in a first state, the first state based on the data stored in the CMOS memory cell, where landing the first micromirror comprises landing the first sculpted edge facing a second sculpted edge of a second micromirror. The first sculpted edge and the second sculpted edge are configured to provide a first gap and a second gap between the first micromirror and the second micromirror, where the first gap is larger than the second gap.

BRIEF DESCRIPTION OF THE DRAWINGS

For a detailed description of various examples, reference will now be made to the accompanying drawings in which.

DETAILED DESCRIPTION

Figure 1:
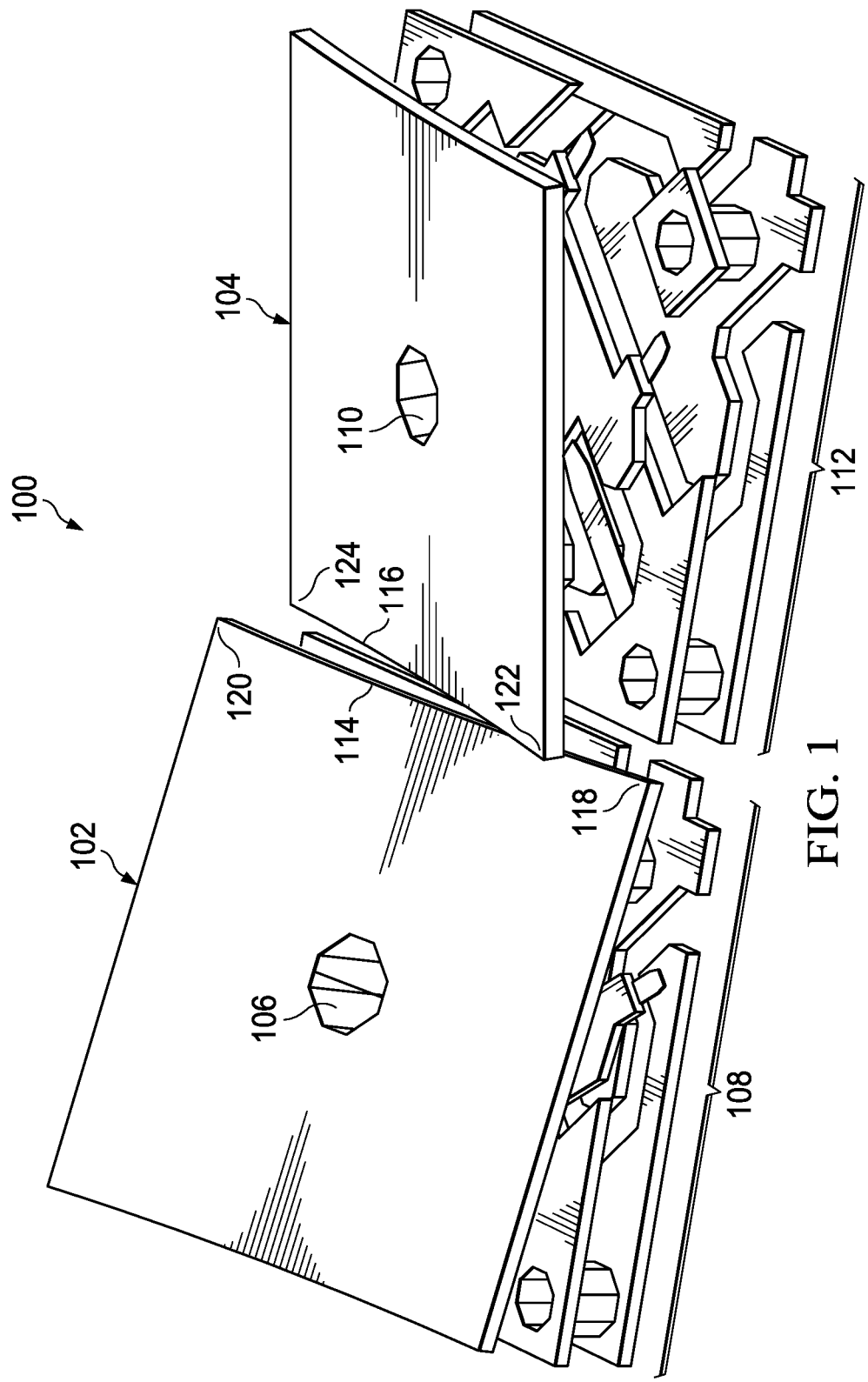
FIG. 1 is a schematic diagram of sculpted micromirrors in accordance with various examples.

A digital micromirror device (DMD) is a micro-electrical-mechanical system (MEMS) that has on its surface an array of several hundred thousand or millions of microscopic mirrors, often made of aluminum. Each micromirror corresponds to a pixel in an image from light that is projected onto the micromirrors and then reflected from the micromirrors to a display. The micromirrors can be individually rotated (±10°, ±12°, ±14.5°, or ±17° in various examples) to an on or off state. The on or off status of each micromirror is programmed so the image will be reflected onto the display. In the on state, light from a projector bulb is reflected from the micromirror to a lens, making a pixel appear bright on the display. In the off state, the light is reflected elsewhere (away from the lens and onto a heatsink), making the pixel appear dark on the display. Rapidly toggling the micromirror between the on and off states produces grayscales on the display, which are controlled by the ratio of on-time to off-time. Also, colored light is projected towards the micromirrors to produce color images.

For rectangular micromirrors arranged in an array, the micromirrors are configured to tilt either away from or towards one another by applying various voltages to the micromirrors. As the micromirrors tilt toward each other, the centers of the micromirror edges come close together. During operation, a first block of micromirrors may have a different voltage applied to it than a second block of adjacent micromirrors. A potential difference across two micromirrors tilted towards each other could cause those two micromirrors to be attracted towards one another. An electrical short could occur across the micromirrors due to this potential difference and cause damage in some cases.

In some systems, the micromirrors are sized so there is enough space between micromirrors to avoid this type of damage. The spacing between micromirrors is called a gap. The gap between micromirrors is the distance between a first point along an edge of a first micromirror and the point along an edge of a second micromirror that is nearest to the first point. The gap is therefore the minimum clearance between micromirrors that are next to one another, the micromirrors being next to one another because they are either in the same row or in the same column of the array. As the gap between micromirrors increases, the micromirror size becomes smaller and leads to several performance tradeoffs. Gaps allow light to shine between the micromirrors, which causes stray light to leak into a projection aperture degrading image contrast ratio if the micromirrors are in the off state. Large gaps also reduce the reflective area of the mirror reducing system brightness and efficiency. If micromirror gaps are large, the light that leaks between micromirrors can cause optical scatter and can also heat up the understructure of the micromirror, which can negatively affect the overall temperature of the device.

This description provides examples of micromirrors that have one or more sculpted edges. Sculpting the edges of the micromirrors facilitates the gaps between micromirrors to be selectively sized so the gaps are larger in areas along the edges where the adjacent micromirrors come close together during operation, and smaller in areas along the edges where the micromirrors remain farther apart during operation. The sculpted micromirror designs described herein may be implemented on micromirrors that use a torsion hinge architecture, which is described below. The sculpted micromirror designs may be implemented on micromirrors that use other types of hinge architectures as well. In some examples, a micromirror has two sculpted, opposing edges, while in other examples, a micromirror has four sculpted edges (e.g., all edges of the micromirror are sculpted).

FIG. 1 is a schematic diagram of a system 100 that shows an angled view of sculpted micromirrors 102 and 104 in a DMD, in accordance with various examples. Only two micromirrors 102 and 104 are shown, but in a DMD there may be other similar micromirrors arranged in an array of parallel rows and columns. The micromirrors in a DMD are reflective, individually positionable, and digitally switchable (e.g., on or off). System 100 includes a mirror via 106. Mirror via 106 is a support that holds micromirror 102 in place and is coupled to an understructure 108. The details of the understructure 108 are described in other figures below. Mirror via 110 holds micromirror 104 in place and is coupled to its respective understructure 112, which is also described in other figures below. The understructures 108 and 112 allow the micromirrors 102 and 104 to be switched individually to the on or off state.

Micromirror 102 is in an "on" state and micromirror 104 is in an "off" state in this example. Responsive to the micromirror 102 being in the "on" state as shown, micromirror 102 is tilted towards micromirror 104. Responsive to the micromirror 104 being in the "off" state, micromirror 104 is tilted towards micromirror 102. As shown in this example, if the micromirrors 102 and 104 are tilted towards one another, right edge 114 of micromirror 102 and left edge 116 of micromirror 104 become closer to one another. If the gap between right edge 114 and left edge 116 is too small, an electrical short could occur as described above. As seen in system 100, however, there is a vertical height difference between portions of right edge 114 and portions of left edge 116. The front corner 118 of right edge 114 is pulled down towards understructure 108 while micromirror 102 is in the "on" state. The back corner 120 of right edge 114 is pulled up away from understructure 108. For micromirror 104, the front corner 122 of left edge 116 is pulled up away from the understructure 112, while the back corner 124 of left edge 116 is pulled down towards understructure 112. Therefore front corner 118 of micromirror 102 is vertically distant from front corner 122 of micromirror 104. Likewise, back corner 120 of micromirror 102 is vertically distant from back corner 124 of micromirror 104. Because of this vertical distance, damage as described above is unlikely to occur at the corners (118, 120, 122, and 124) of right edge 114 and left edge 116. However, the centers of right edge 114 and left edge 116 are close to one another while micromirrors 102 and 104 are in these respective states. Damage due to micromirrors 102 and 104 touching one another is more likely to occur near the centers of these edges. In examples described herein, right edge 114 and left edge 116 are sculpted so the gap between micromirrors 102 and 104 at the centers of the edges 114 and 116 is larger than the gap near the corners (118, 120, 122, and 124) of the edges 114 and 116. As described below, some or all of the edges of micromirrors 102 and 104 are sculpted in a concave-like manner so a larger gap occurs between the micromirrors at the centers of the edges than at the corners. Adjusting the geometry of the micromirrors in this manner allows a larger gap at the points where damage may occur while keeping a smaller gap at other points to preserve optical quality.

In FIG. 1, the right and left edges of both micromirrors 102 and 104 are sculpted edges. The sculpting may be difficult to perceive in FIG. 1 and FIGS. 2-3 below because in these examples the edges are sculpted only a slight amount. The sculpting of the edges is shown with greater clarity in other figures below, such as FIGS. 5-8.

Figure 2:
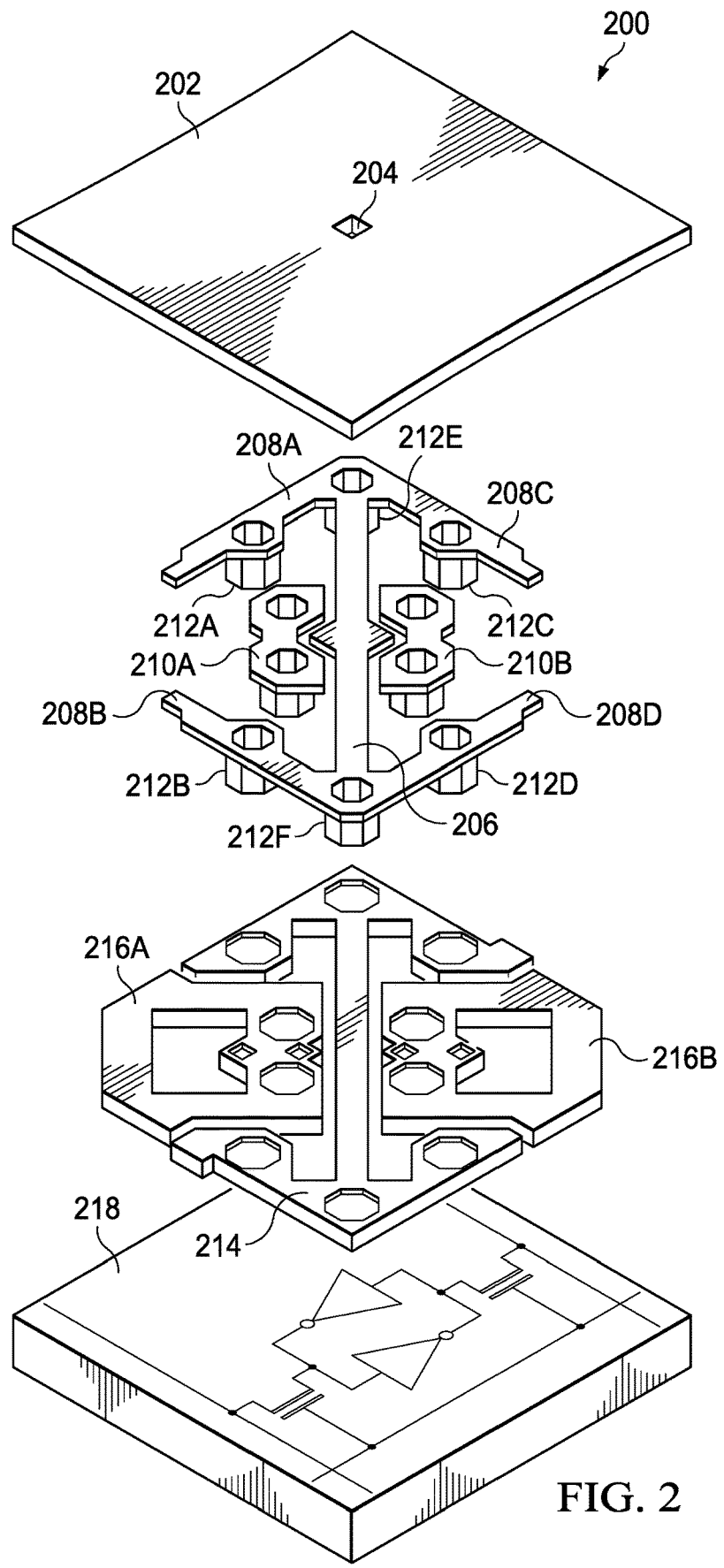
FIG. 2 is a schematic diagram of a sculpted micromirror in accordance with various examples.

FIG. 2 is a schematic diagram of an example system 200 that includes an example sculpted micromirror 202 and an example understructure that controls sculpted micromirror 202 in accordance with various examples. FIG. 2 is an exploded view of various components of system 200. In system 200, sculpted micromirror 202 (which, in examples, is representative of sculpted micromirrors 102, 104 from FIG. 1) includes either two sculpted edges or four sculpted edges in various examples described herein. In other examples, sculpted micromirror 202 includes one sculpted edge or three sculpted edges. Mirror via 204 is shown at the center of sculpted micromirror 202. Mirror via 204 is coupled to sculpted micromirror 202 and hinge 206. Hinge 206 is a torsion hinge in this example. Hinge 206 runs diagonally along the bottom of sculpted micromirror 202. Hinge 206 allows sculpted micromirror 202 to be rotated or tilted to either the "on" or "off" state. In this example, hinge 206 tilts sculpted micromirror 202 to either the left or the right. Hinge 206 tilts sculpted micromirror 202 a specific number of degrees in either direction. For example, sculpted micromirror 202 may tilt ±10°, ±12°, ±14.5°, or ±17° in various examples. Other tilt angles are useful in other examples.

Hinge 206 is coupled to four spring tips 208A, 208B, 208C, and 208D (collectively spring tips 208). Spring tips 208 provide a stopping point for sculpted micromirror 202 as sculpted micromirror 202 rotates. For example, as sculpted micromirror 202 rotates to the left due to the rotation of hinge 206, sculpted micromirror 202 rotates until the underside of sculpted micromirror 202 comes into contact with spring tips 208A and 208B. As sculpted micromirror 202 rotates to the right due to the rotation of hinge 206, sculpted micromirror 202 rotates until the underside of sculpted micromirror 202 comes into contact with spring tips 208C and 208D. Sculpted micromirror 202 lands on the spring tips 208 and therefore this structure is referred to as a landed micromirror. System 200 is designed so sculpted micromirror 202 is at the programmed tilt angle after sculpted micromirror 202 lands on the spring tips 208.

System 200 also includes two raised address electrodes: first raised address electrode 210A and second raised address electrode 210B (collectively, raised address electrodes 210). An address voltage is applied to first raised address electrode 210A and second raised address electrode 210B during the operation of system 200, which is described below. System 200 also includes hinge support vias 212A, 212B, 212C, 212D, 212E, and 212F (collectively hinge support vias 212). Hinge support vias 212 couple hinge 206 to reset bus 214 (also called as a bias/reset bus). System 200 also includes two metal address pads: first address pad 216A and second address pad 216B and complementary metal-oxide-semiconductor (CMOS) memory cell 218.

In an example operation, a DMD is used in conjunction with a digital controller chip. Each individual micromirror (such as sculpted micromirror 202) is positioned over a corresponding CMOS memory cell (such as CMOS memory cell 218). The angular position of a particular micromirror (e.g., the on or off state) is determined by the binary state (logic 0 or 1) of the corresponding CMOS memory cell contents after a micromirror clocking pulse is applied. CMOS memory cell 218 includes two memory elements. The state of the two memory elements of CMOS memory cell 218 are not independent, but are always opposite. That is, if one element is 1 the other element is 0, and vice versa. For example, if the contents of the two memory elements are (1,0), the micromirror is in the "on" state. If the contents of the two memory elements are (0,1), the micromirror is in the "off" state. A controller loads the appropriate bits into each CMOS memory cell 218 in the micromirror array based on the image that is programmed for display.

However, loading CMOS memory cell 218 does not automatically change the mechanical state of sculpted micromirror 202. After sculpted micromirror 202 has landed to an on or off state, changing the state of CMOS memory cell 218 will not cause sculpted micromirror 202 to flip to the other state. In order for the state of CMOS memory cell 218 to be transferred to the mechanical position of sculpted micromirror 202, the pixel has to undergo a reset. This reset momentarily releases sculpted micromirror 202 from its current landed position and then re-lands sculpted micromirror 202 based on the state of sculpted micromirror 202's associated CMOS memory cell 218. A reset performed in this manner allows groups of CMOS memory cells to be pre-loaded and then the micromirrors coupled to each of those CMOS memory cells will change their mechanical position simultaneously. The reset is caused by the application of the micromirror clocking pulse.

Therefore, the state of sculpted micromirror 202 changes synchronously with the micromirror clocking pulse, rather than changing with the CMOS memory cell 218 data update. Writing a logic 1 into a memory cell followed by a micromirror clocking pulse results in the corresponding micromirror switching to the "on" state, and writing a logic 0 into a memory cell followed by a micromirror clocking pulse results in the corresponding micromirror switching to the "off" state. In an example, micromirror clocking pulses are provided internally by the DMD chip, with the application of the pulses being coordinated by the digital controller. Micromirror clocking pulses are applied to the micromirror assembly via reset bus 214.

Setting the position of sculpted micromirror 202 occurs electrostatically. The output of the CMOS memory cell 218 and its complement control the opposite potentials applied to raised address electrodes 210A and 210B located below sculpted micromirror 202 on respective sides of the axis of hinge 206. Responsive to an appropriate bias/reset potential (e.g., the micromirror clocking pulse) applied to the micromirror assembly via reset bus 214, sculpted micromirror 202 tilts about its hinge 206 axis in attraction to the raised address electrode (210A or 210B) with the greatest potential difference relative to the bias/reset potential. Sculpted micromirror 202 lands on the spring tips 208 closest to that raised address electrode 210, preventing contact of sculpted micromirror 202 with the raised address electrode 210. If the bias/reset potential is removed (e.g., allowed to float or set to 0 volts), sculpted micromirror 202 returns to a flat state.

Thus, setting the position of sculpted micromirror 202 involves the application of three voltage signals to the micromirror pixel: the bias/reset voltage, the address voltage (stored in one memory element of CMOS memory cell 218), and the address complement voltage (stored in the other memory element of CMOS memory cell 218). In one example, the memory cell provides two address voltage states: address voltage (0, 3.3 V) and address complement voltage (3.3, 0 V). Depending on the contents of the two memory elements in CMOS memory cell 218, either the address voltages (0, 3.3 V) or the address complement voltages (3.3, 0 V) are applied to raised address electrodes 210A and 210B through the address pads 216A and 216B, respectively, via contacts to the underlying CMOS memory cell 218 structure. For each pixel in a common reset block of micromirrors, the bias/reset voltage is applied via routing to the reset bus 214, to hinge 206 through the hinge support vias 212, and then to sculpted micromirror 202 through mirror via 204.

In an example operation, sculpted micromirror 202 is in an initial flat-state or parked position (e.g., not tilted in either direction) with the mirror bias/reset voltage set to 0 volts. In this example, logic 0 is applied to CMOS memory cell 218, which applies an address voltage of 0 volts to first raised address electrode 210A and an address complement voltage of 3.3 volts to second raised address electrode 210B. The bias/reset voltage is then raised to 26 volts, which tilts the micromirror 202 about the axis of hinge 206, away from the raised address electrode 210 to which the address complement voltage (3.3 volts) is applied (e.g., away from second raised address electrode 210B) and toward the raised address electrode 210 to which the address voltage (0 volts) is applied (e.g., toward first raised address electrode 210A). This sets sculpted micromirror 202 into a −12° "off" state position.

Shifting sculpted micromirror 202 into the other +12° "on" state position involves a similar operation. The logic 1 is applied to CMOS memory cell 218, which applies an address voltage of 3.3 volts to first raised address electrode 210A and an address complement voltage of 0 volts to second raised address electrode 210B. The increase from 0 volts to 3.3 volts of first raised address electrode 210A and the decrease from 3.3 volts to 0 volts of second raised address electrode 210B do not affect the potential difference (relative to the 26 volt micromirror voltage) significantly enough to move sculpted micromirror 202 out of its tilted "off" state position. Thus, sculpted micromirror 202 remains in its "off" state position after the updated loading of CMOS memory cell 218 until the application of a bias/reset pulse to sculpted micromirror 202 through the reset bus 214. As the bias/reset pulse occurs, sculpted micromirror 202 is released to move through the flat state position into the +12° "on" state position (away from first raised address electrode 210A and towards second raised address electrode 210B).

Figure 3A:
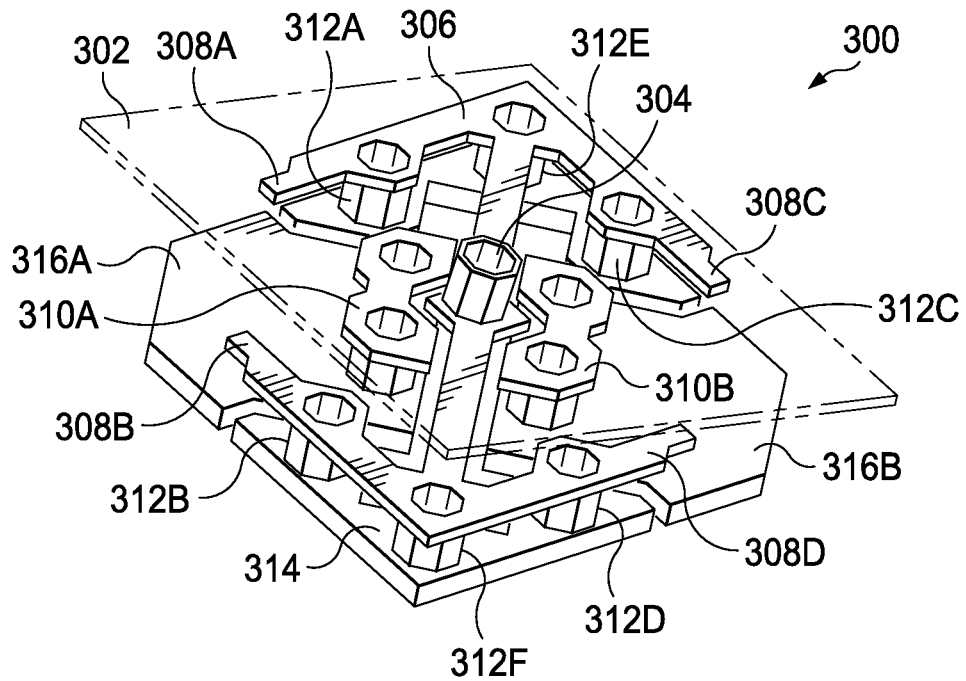
FIG. 3A is a schematic diagram of a sculpted micromirror in accordance with various examples.
Figure 3B:
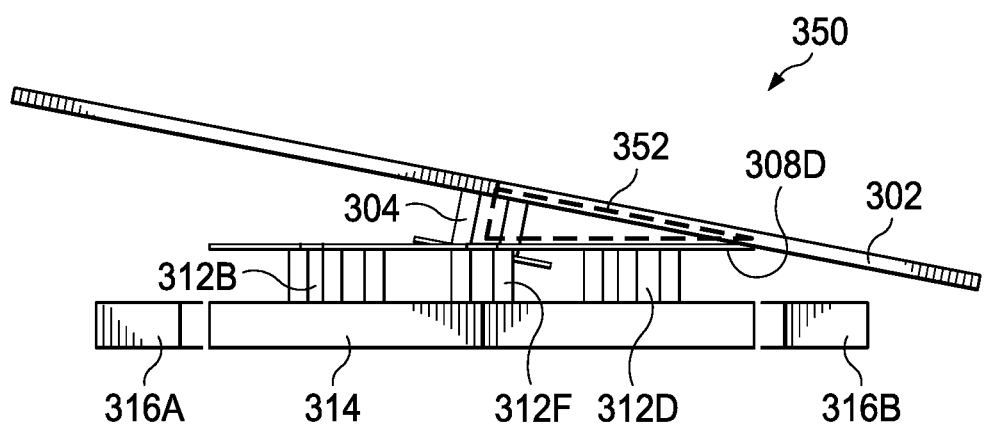
FIG. 3B is a schematic diagram of a sculpted micromirror in accordance with various examples.

FIG. 3A is a schematic diagram of a system 300 that includes a sculpted micromirror 302 in accordance with various examples. In FIGS. 2, 3A and 3B, like numerals refer to like parts (such as 206 and 306 refer to the hinge, 212 and 312 refer to hinge support vias, etc.). System 300 is a non-exploded view of a micromirror, hinge, address electrodes, and bias/reset bus to show the structure of the components described above with respect to FIG. 2. Sculpted micromirror 302 is shown as transparent so the other components are visible. System 300 includes sculpted micromirror 302 coupled to mirror via 304. Mirror via 304 is coupled to hinge 306. Spring tips 308A, 308B, 308C, and 308D (collectively, spring tips 308) are coupled to hinge 306. Raised address electrodes 310A and 310B are located on each side of the axis of hinge 306. Hinge support vias 312A, 312B, 312C, 312D, 312E, and 312F (collectively, hinge support vias 312) are coupled to hinge 306 and also coupled to bias/reset bus 314. Metal address pads 316A and 316B are coupled to raised address electrodes 310A and 310B. In this example, sculpted micromirror 302 is tilted to the right where the underside of sculpted micromirror 302 is in contact with spring tips 308C and 308D, which places sculpted micromirror 302 in its programmed landing position.

FIG. 3B is a schematic diagram of a system 350 that includes the sculpted micromirror 302 in accordance with various examples. FIG. 3B is a side view of sculpted micromirror 302 shown in FIG. 3A, again tilted to the right. In system 350, mirror via 304 is coupled to sculpted micromirror 302. In the side view of system 350, sculpted micromirror 302 is landed on the spring tips 308 on the right side and spring tip 308D is visible. Hinge support vias 312B, 312D, and 312F are also visible in this side view. Hinge support vias 312 are coupled to bias/reset bus 314. The edges of metal address pads 316A and 316B are also shown in FIG. 3B.

System 350 also includes tilt angle 352. Tilt angle 352 is the angle formed between sculpted micromirror 302 and the flat upper surface of spring tips 308, such as spring tip 308D. As described above, tilt angle 352 may be ±10°, ±12°, ±14.3°, or ±17° in various examples. Other tilt angles are useful in other examples.

Figure 4:
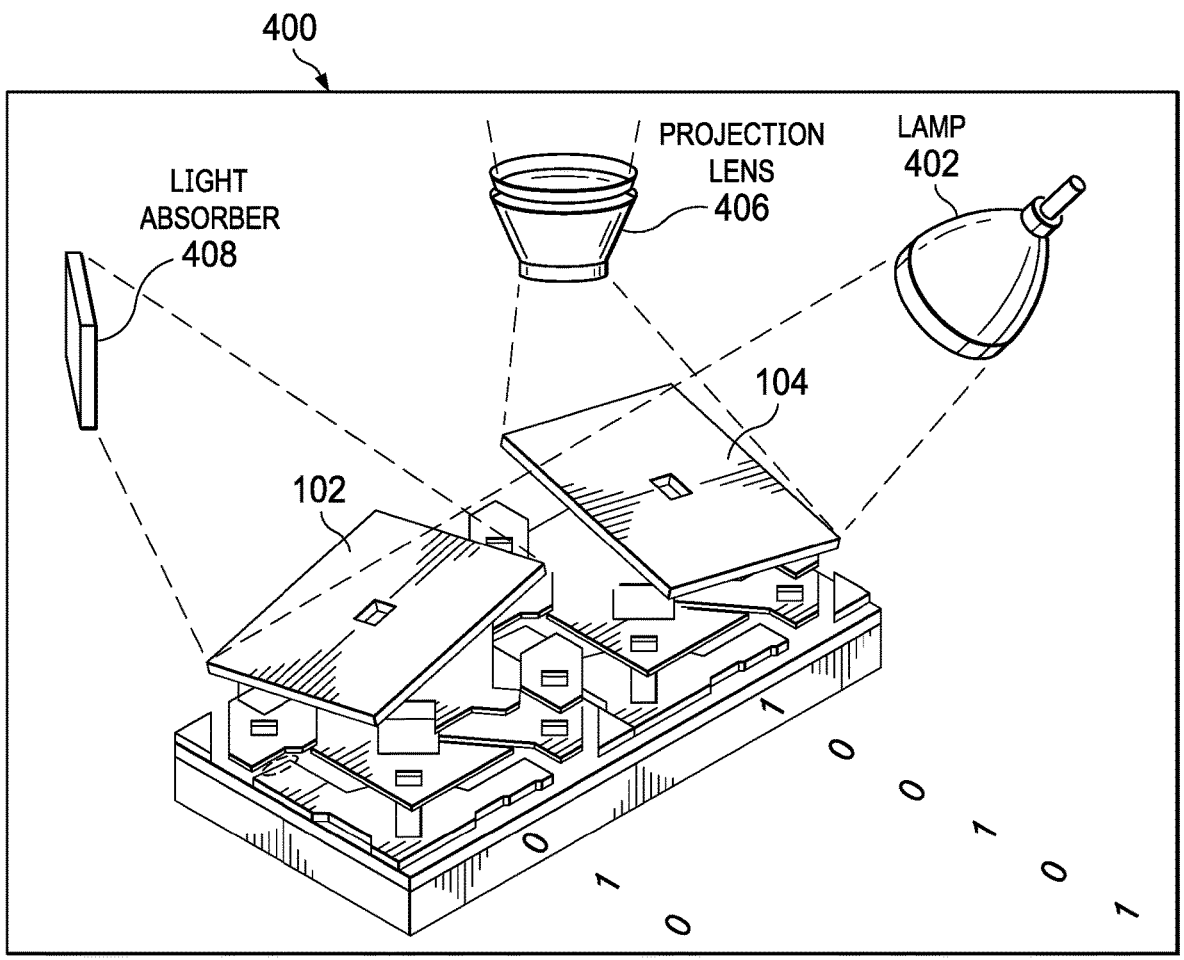
FIG. 4 is a schematic diagram of an image display system utilizing a digital micromirror device in accordance with various examples.

FIG. 4 is a schematic diagram of an image display system 400 according to an example. Image display system 400 includes a light source such as lamp 402. Lamp 402 is configured to project light onto an array of micromirrors. Micromirrors 102 and 104 are shown in image display system 400. Micromirrors 102 and 104 are sculpted micromirrors in this example. The positions of micromirrors 102 and 104 are individually settable in synchronization with image data and with the light from lamp 402 to either direct light onto an imaging surface through a projection lens 406 (based on the mirror being in the "on" position) or to block or direct light away from the imaging surface, such as to a light absorber 408 (based on the mirror being in the "off" position). For simplicity, FIG. 4 shows two micromirrors; however, a micromirror array will usually have thousands of such mirrors arranged in rows and columns.

Figure 5:
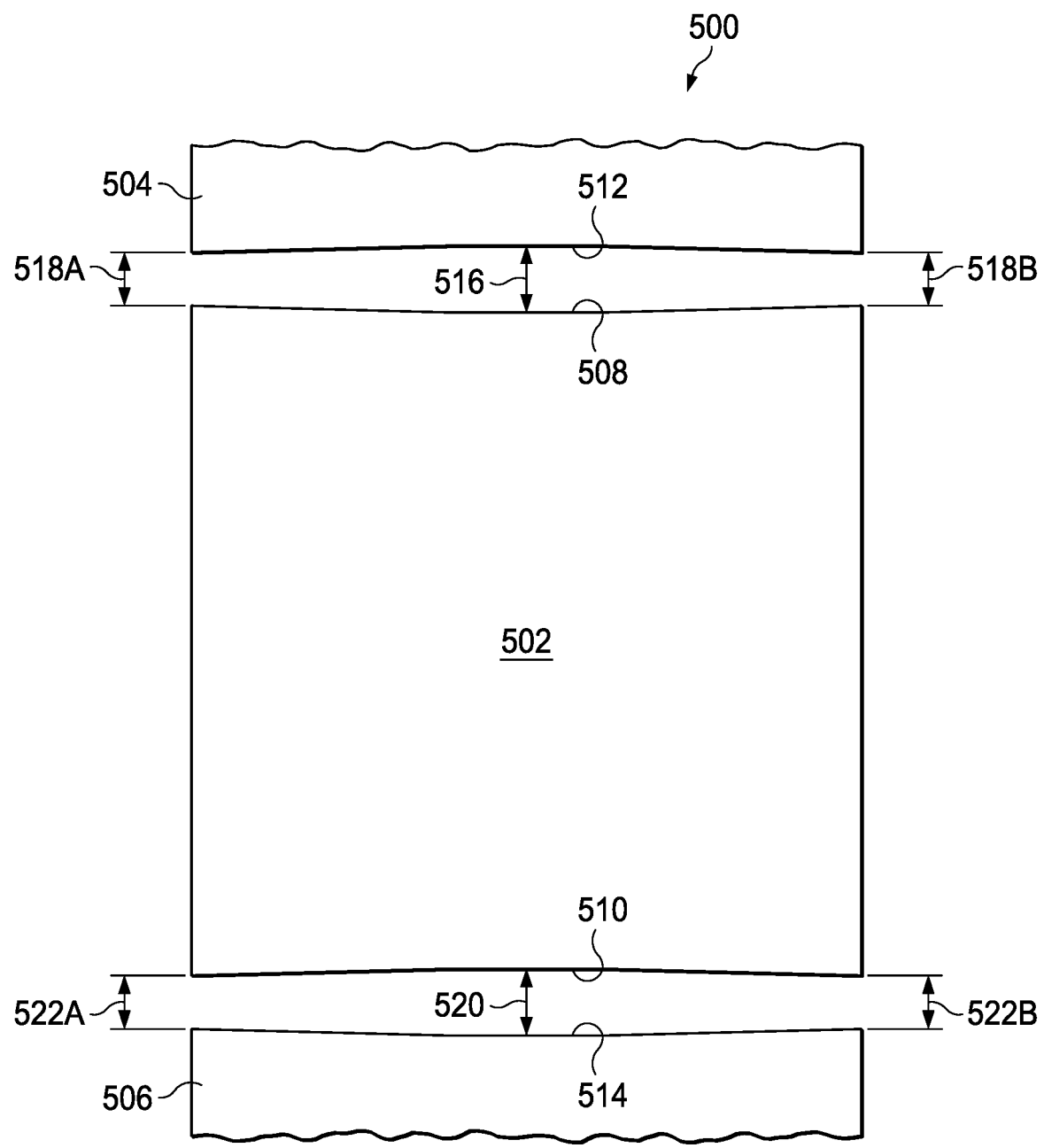
FIG. 5 is a schematic diagram of a sculpted micromirror in accordance with various examples.

FIG. 5 is a schematic diagram of a system 500 with sculpted micromirrors in accordance with various examples. In system 500 sculpted micromirror 502 is a first micromirror of a first micromirror pixel. Adjacent sculpted micromirror 504 is a second micromirror of a second micromirror pixel and is situated above sculpted micromirror 502. Adjacent sculpted micromirror 506 is a third micromirror of a third micromirror pixel and is situated below sculpted micromirror 502. Sculpted micromirrors 502, 504, and 506 may be consecutive micromirrors in a row or column of an array of micromirror pixels. Sculpted micromirror 502 is an example of a sculpted micromirror such as micromirrors 102, 104, 202, and 302 shown in FIGS. 1-3 above. In a micromirror array, micromirrors may also be present to the left and right of sculpted micromirrors 502, 504, and 506, but those additional micromirrors are not shown in FIG. 5 for simplicity.

In this example, sculpted micromirror 502 includes two sculpted edges, a sculpted top edge 508 and a sculpted bottom edge 510. In other examples, all four edges of sculpted micromirror 502 may be sculpted. Sculpted micromirror 504 has a sculpted bottom edge 512, and sculpted micromirror 506 has a sculpted top edge 514. The sculpted edges have a concave shape in this example. Because of sculpted top edge 508 and sculpted bottom edge 512, the gap between sculpted micromirrors 502 and 504 is larger in the center along the sculpted edges 508 and 512 than at the ends of the sculpted edges 508 and 512. The middle gap 516 is larger than the corner gaps 518A and 518B. Middle gap 516 is a first gap between a first point on sculpted edge 508 and the nearest point to the first point on a second sculpted micromirror 504. The middle gap 516 is larger than the corner gap 518A between a second point on sculpted edge 508 and a nearest point to the second point on the second sculpted micromirror 504. As described above with respect to FIG. 4, in conventional systems the gap near the middle of the edges is small if the adjacent micromirrors are tilted towards one another. Therefore the sculpted micromirrors 502, 504, and 506 in FIG. 5 have a larger gap in the middle so an appropriate distance can be maintained between the edges of the sculpted micromirrors 502, 504, and 506 to prevent damage during operation. As shown in FIG. 1, the corners of the edges of adjacent micromirrors are at different vertical heights during certain micromirror positions and so a smaller gap can be used. Thus, as seen in FIG. 5, corner gaps 518A and 518B are smaller than middle gap 516.

Smaller corner gaps allow for a larger total surface area of the DMD to be covered by micromirrors. As described above, gaps allow light to shine between the micromirrors, which can cause optical scatter and also heat up the understructure of the micromirror, which affects the overall temperature of the device. The sculpted top edge 508 and sculpted bottom edge 512 of the sculpted micromirrors 502 and 504, respectively, provide the larger gap (e.g., the middle gap) where it is most useful while also providing a smaller gap at the corners to cover a larger total surface area of the DMD with micromirrors. The ratio between the "useful" (reflective) area of a DMD and the complete area of the array, which includes the gaps and the vias, is known as the on-state fill factor. The fill factor is the fraction of a DMD pixel that is actually reflective. A sculpted micromirror array helps to protect against damage caused by gaps that are too small while also providing a higher fill factor than micromirror arrays that have gaps that are too large.

In system 500, sculpted micromirror 502 also has a sculpted bottom edge 510 that is adjacent to sculpted top edge 514 of micromirror 506. Because of these sculpted edges, middle gap 520 is larger than corner gaps 522A and 522B. System 500 therefore shows a middle gap 516 (e.g., a first gap) between a first center of a first edge (sculpted top edge 508) and a second adjacent sculpted micromirror 504. The middle gap 516 is larger than a corner gap 522A (e.g., a second gap) between a first end of sculpted top edge 508 and the second adjacent sculpted micromirror 504.

Figure 6:
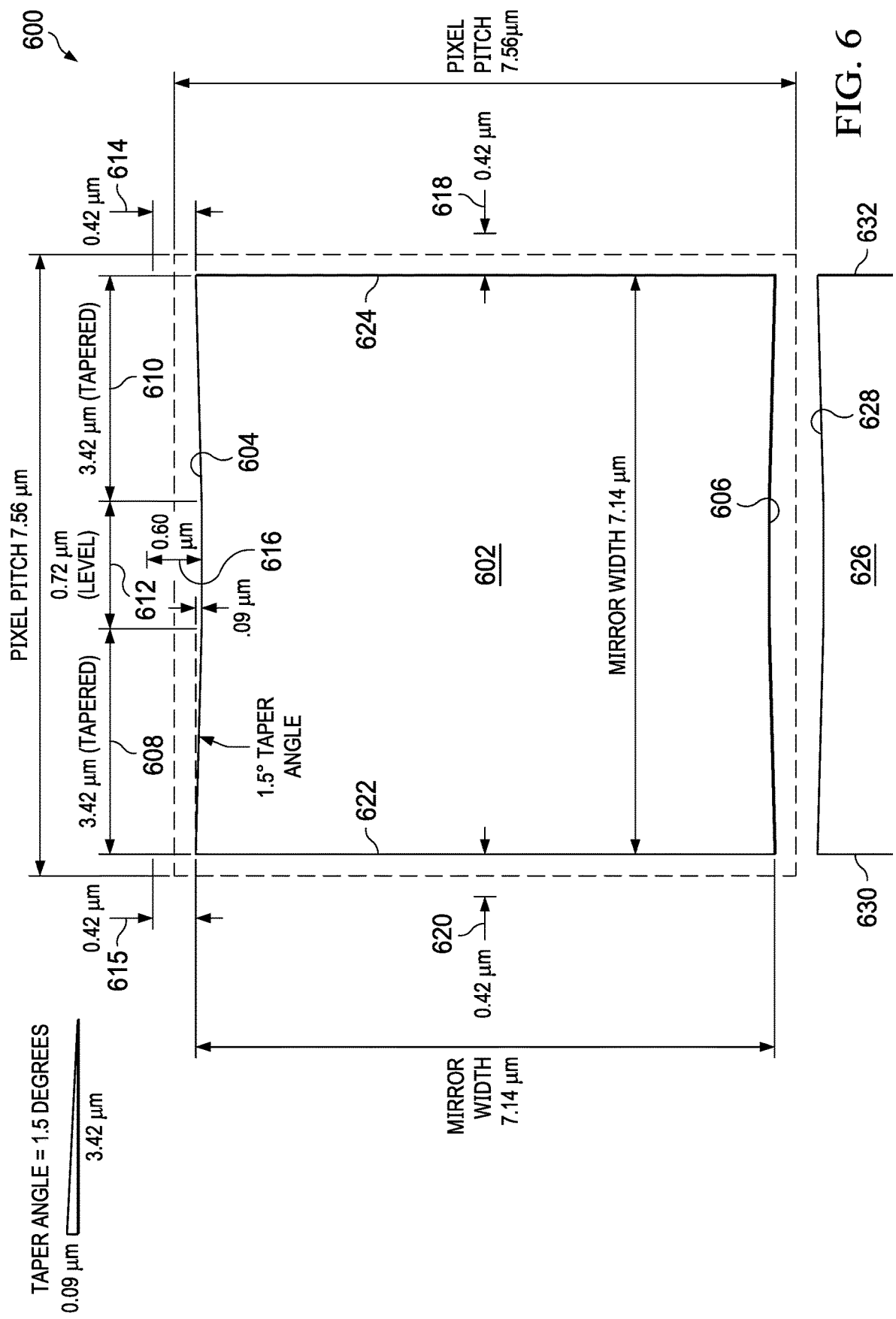
FIG. 6 is a schematic diagram of a sculpted micromirror in accordance with various examples.

FIG. 6 is a schematic diagram of a system 600 in accordance with an example. System 600 includes a micromirror 602. Micromirror 602 is an example of a sculpted micromirror such as micromirrors 102, 104, 202, and 302 shown in FIGS. 1-3 above. Micromirror 602 is a sculpted micromirror that includes a top edge 604 and a bottom edge 606 that are sculpted. Top edge 604 and bottom edge 606 have similar sculpting in this example. In other examples, top edge 604 and bottom edge 606 may have different sculpting. In this example, left edge 622 and right edge 624 of micromirror 602 are not sculpted but those edges may also be sculpted in other examples.

Micromirror 602 is one micromirror in an array of micromirrors that have a pixel pitch of 7.56 μm (micrometers) as shown in FIG. 6. The pixel pitch is the distance from the center of one pixel to the center of an adjacent pixel. Micromirror 602 also has a width and height of 7.14 μm. On micromirror 602, top edge 604 is sculpted and has three sections: sections 608, 610, and 612. Section 608 begins at the far left end of top edge 604 and extends 3.42 μm. Section 608 is sculpted at an angle of approximately 1.5°. The left end of section 608 is approximately 0.09 μm higher than the right end of section 608. The measurements in this example are approximate and may vary in other examples.

Section 610 of top edge 604 begins at the far right end of top edge 604 and also extends 3.42 μm. The right end of section 610 is approximately 0.09 μm higher than the left end of section 610. Section 610 is also sculpted at an angle of approximately 1.5°. Between section 608 and section 610 lies section 612. In this example, section 612 is approximately "level." Section 612 is approximately parallel to a similar section near the middle of edge 606. Section 612 is also approximately perpendicular to the right and left edges of micromirror 602. In examples herein, the terms "level" or "perpendicular" are approximate, and may vary due to fabrication tolerances. Section 612 is the section of top edge 604 that is furthest from the adjacent micromirror. Section 612 extends approximately 0.72 μm in this example.

The measurements in FIG. 6 are approximate and are selected to illustrate one example. Other dimensions may be used in other examples. The angle of sculpting may range from 0.5° to 4.0° in other examples. The length of section 612 can also vary from 0.2 μm to 1.2 μm in other examples, with corresponding adjustments to the lengths of sections 608 and 610. Additionally, the lengths of sections 608, 610, and 612 may vary as the mirror width and/or pixel pitch varies. The ratio of the lengths between sections 608, 610, and 612 may also vary in other examples. In one example, section 608 may be a different length than section 610.

As shown in system 600, gap 614 is 0.42 μm. Gap 614 is the gap between micromirror 602 and the adjacent micromirror at the top right corner of micromirror 602. Gap 615 is also 0.42 μm. Gap 615 is the gap between micromirror 602 and the adjacent micromirror at the top left corner of micromirror 602. Gap 616 is 0.60 μm. Gap 616 is the gap between the center of top edge 604 and the adjacent micromirror. Therefore, micromirror 602 has a larger gap at the center of top edge 604 than near the ends of top edge 604. If micromirror 602 is tilted opposite to the micromirror nearest top edge 604, the larger gap 616 will help prevent damage to the micromirrors, as shown in FIG. 1.

The sculpting that creates section 612 produces a gap 616 of 0.60 μm between top edge 604 and the adjacent micromirror. Because section 612 extends 0.72 μm near the center of top edge 604, gap 616 occurs not only at the center of top edge 604 but also slightly to the right and to the left of the center (approximately 0.36 μm in each direction). This width of section 612 allows for the larger gap 616 to occur not just at a point in the center of top edge 604 but along a larger section of top edge 604. Sculpting the gap 616 along a larger section protects against process variations in the manufacturing of micromirrors, which might result in the nearest point between two adjacent micromirrors being slightly off of the centers of the adjacent edges. That is, the minimum gap between two facing edges of consecutive micromirrors may not occur at the exact center position along the micromirror edge, but slightly to the left or right of the center of the mirror edge. The larger width of section 612 makes it more likely that the larger gap 616 exists wherever the minimum gap between the edges occurs, which might not be at the center position of the micromirror edge.

Although not shown in detail in FIG. 6, bottom edge 606 is also sculpted similarly to top edge 604 in an example. Bottom edge 606 has tapered sections and a straight section similar in size and slope to top edge 604. Gaps between bottom edge 606 and a sculpted edge 628 of an adjacent micromirror are also similar to gaps 614 and 616 described above with respect to top edge 604. In another example, bottom edge 606 is not sculpted. In yet another example, bottom edge 606 is sculpted but is sculpted differently than top edge 604. For example, bottom edge 606 may have tapered sections and a straight section that are different in size than the respective sections on top edge 604.

System 600 also includes micromirror 626 below micromirror 602. In an example, another micromirror may be above micromirror 602 but is not illustrated here for simplicity. Micromirror 626 also has a sculpted edge 628. In this example, sculpted edge 628 is sculpted similarly to edges 604 and 606 of micromirror 602. In other examples, sculpted edge 628 may be sculpted differently than either or both of sculpted edges 604 and 606 of micromirror 602. Micromirror 626 further includes left edge 630 and right edge 632. Edges 630 and 632 are not sculpted in this example but may be sculpted in other examples.

Because micromirror 602 is sculpted on only two edges in this example (top edge 604 and bottom edge 606), gap 618 on the right edge of micromirror 602 is 0.42 μm. Gap 620 on the left edge of micromirror 602 is also 0.42 μm. The left and right edges are not sculpted in this example. Therefore the gaps along the left and right edges are roughly uniform gaps along the edges, if the adjacent micromirror is also not sculpted on the edge that faces micromirror 602. In the examples herein, "uniform" means approximately uniform, as the components described herein may vary due to fabrication tolerances. As described below, a micromirror array divided into blocks can utilize this structure to have smaller gaps on the left and right edges than on the top and bottom edges of the micromirrors.

Figure 7:
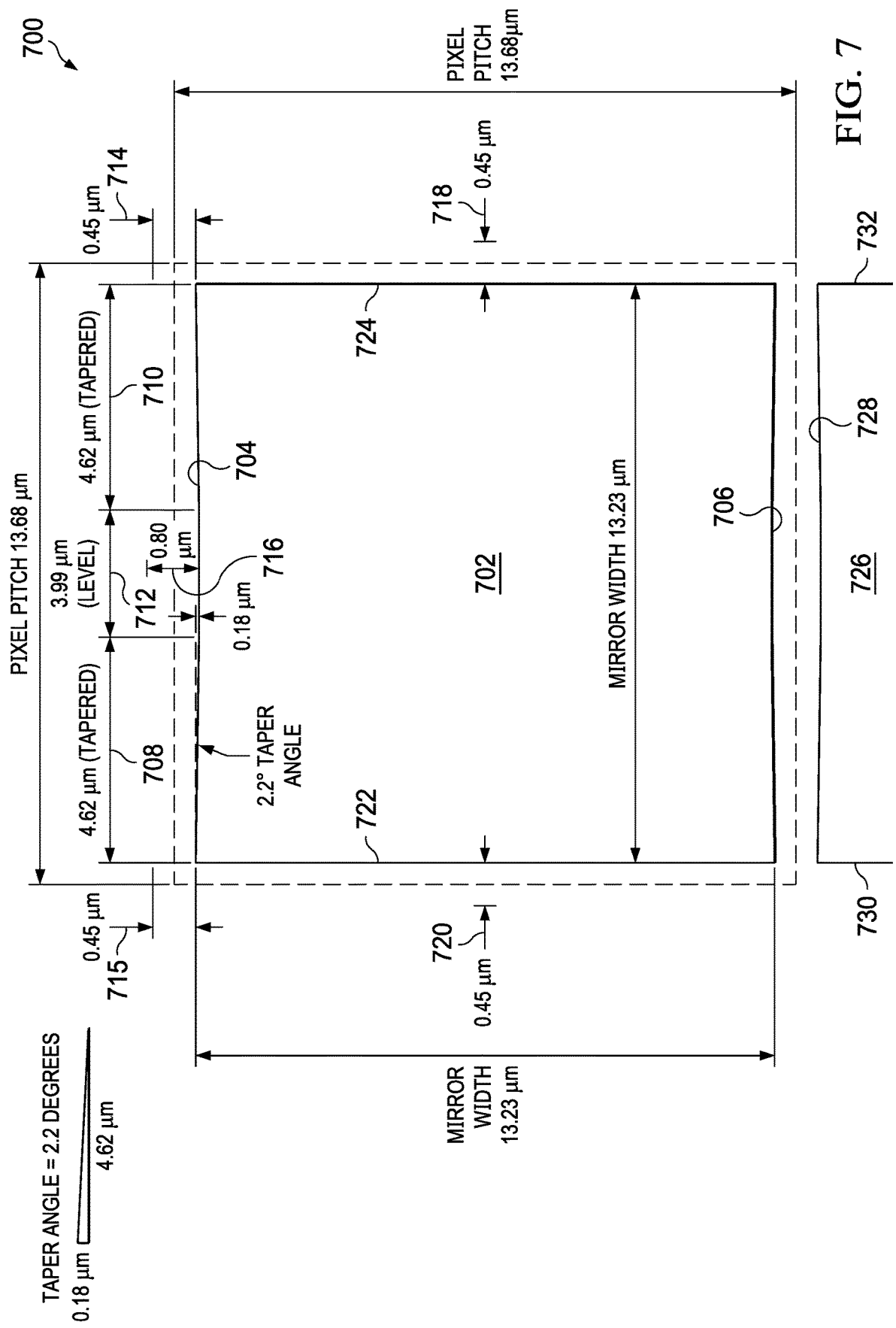
FIG. 7 is a schematic diagram of a sculpted micromirror in accordance with various examples.

FIG. 7 is a schematic diagram of a system 700 in accordance with an example. System 700 includes a micromirror 702. Micromirror 702 is an example of a sculpted micromirror such as micromirrors 102, 104, 202, and 302 shown in FIGS. 1-3 above. Micromirror 702 is a sculpted micromirror that includes a top edge 704 and a bottom edge 706 that are sculpted. Top edge 704 and bottom edge 706 have similar sculpting in this example. In other examples, top edge 704 and bottom edge 706 may have different sculpting. In this example, left edge 722 and right edge 724 of micromirror 702 are not sculpted but those edges may also be sculpted in other examples.

Micromirror 702 is one micromirror in an array of micromirrors that have a pixel pitch of 13.68 μm as shown in FIG. 7. Micromirror 702 also has a width and height of 13.26 μm. On micromirror 702, top edge 704 is sculpted and has three sections: sections 708, 710, and 712. Section 708 begins at the far left end of top edge 704 and extends 4.62 μm. Section 708 is sculpted at an angle of approximately 2.2°. The left end of section 708 is approximately 0.18 μm higher than the right end of section 708. The measurements in this example are approximate and may vary in other examples.

Section 710 of top edge 704 begins at the far right end of top edge 704 and also extends 4.62 μm. The right end of section 710 is approximately 0.18 μm higher than the left end of section 710. Section 710 is also sculpted at an angle of approximately 2.2°. Between section 708 and section 710 lies section 712. In this example, section 712 is approximately "level." Section 712 is approximately parallel to a similar section near the middle of edge 706. Section 712 is also approximately perpendicular to the right and left edges of micromirror 702. Section 712 is the section of top edge 704 that is furthest from the adjacent micromirror. Section 712 extends approximately 3.99 μm in this example.

The measurements in FIG. 7 are approximate and are selected to illustrate one example. Other dimensions may be used in other examples. The angle of sculpting may range from 0.5° to 4.5° in other examples. The length of section 712 can also vary from 1.5 μm to 6.0 μm in other examples, with corresponding adjustments to the lengths of sections 708 and 710. Additionally, the lengths of sections 708, 710, and 712 may vary as the mirror width and/or pixel pitch varies. The ratio of the lengths between sections 708, 710, and 712 may also vary in other examples. In one example, section 708 may be a different length than section 710.

As shown in system 700, gap 714 is 0.45 μm. Gap 714 is the gap between micromirror 702 and the adjacent micromirror at the top right corner of micromirror 702. Gap 715 is also 0.45 μm. Gap 715 is the gap between micromirror 702 and the adjacent micromirror at the top left corner of micromirror 702. Gap 716 is 0.80 μm. Gap 716 is the gap between the center of top edge 704 and the adjacent micromirror. Therefore, micromirror 702 has a larger gap at the center of top edge 704 than near the ends of top edge 704. If micromirror 702 is tilted opposite to the micromirror nearest top edge 704, the larger gap 716 will help prevent damage to the micromirrors, as shown in FIG. 1. Because micromirror 702 is sculpted on two edges, gap 718 on the right edge of micromirror 702 is 0.45 μm. Gap 720 on the left edge of micromirror 702 is also 0.45 μm. The left and right edges are not sculpted in this example.

Although not shown in detail in FIG. 7, bottom edge 706 is also sculpted similarly to top edge 704 in an example. Bottom edge 706 has tapered sections and a straight section similar in size and shape to top edge 704. Gaps between bottom edge 706 and edge 728 of an adjacent micromirror are also similar to gaps 714 and 716 described above with respect to top edge 704. In another example, bottom edge 706 is not sculpted. In yet another example, bottom edge 706 is sculpted but is sculpted differently than top edge 704. For example, bottom edge 706 may have tapered sections and a straight section that are different in size than the respective sections on top edge 704.

System 700 also includes micromirror 726 below micromirror 702. In an example, another micromirror may be above micromirror 702 but is not illustrated here for simplicity. Micromirror 726 also has a sculpted edge 728. In this example, sculpted edge 728 is sculpted similarly to edges 704 and 706 of micromirror 702. In other examples, sculpted edge 728 may be sculpted differently than either or both of sculpted edges 704 and 706 of micromirror 702. Micromirror 726 further includes left edge 730 and right edge 732. Edges 730 and 732 are not sculpted in this example but may be sculpted in other examples.

Because micromirror 702 is sculpted on only two edges in this example (top edge 704 and bottom edge 706), gap 718 on the right edge of micromirror 702 is 0.45 μm. Gap 720 on the left edge of micromirror 702 is also 0.45 μm. The left and right edges are not sculpted in this example. Therefore the gaps along the left and right edges are roughly uniform gaps along the edges, if the adjacent micromirror is also not sculpted on the edge that faces micromirror 702. As described below, a micromirror array divided into blocks can utilize this structure to have smaller gaps on the left and right edges than on the top and bottom edges of the micromirrors.

In another example, the micromirrors in an array have a pixel pitch of approximately 9.0 μm. In another example, the micromirrors in an array have a pixel pitch of approximately 10.8 μm. In those examples, an appropriate sculpting of the micromirror edges is useful to produce a gap that prevents damage to the micromirrors during operation of the micromirror array.

Figure 8:
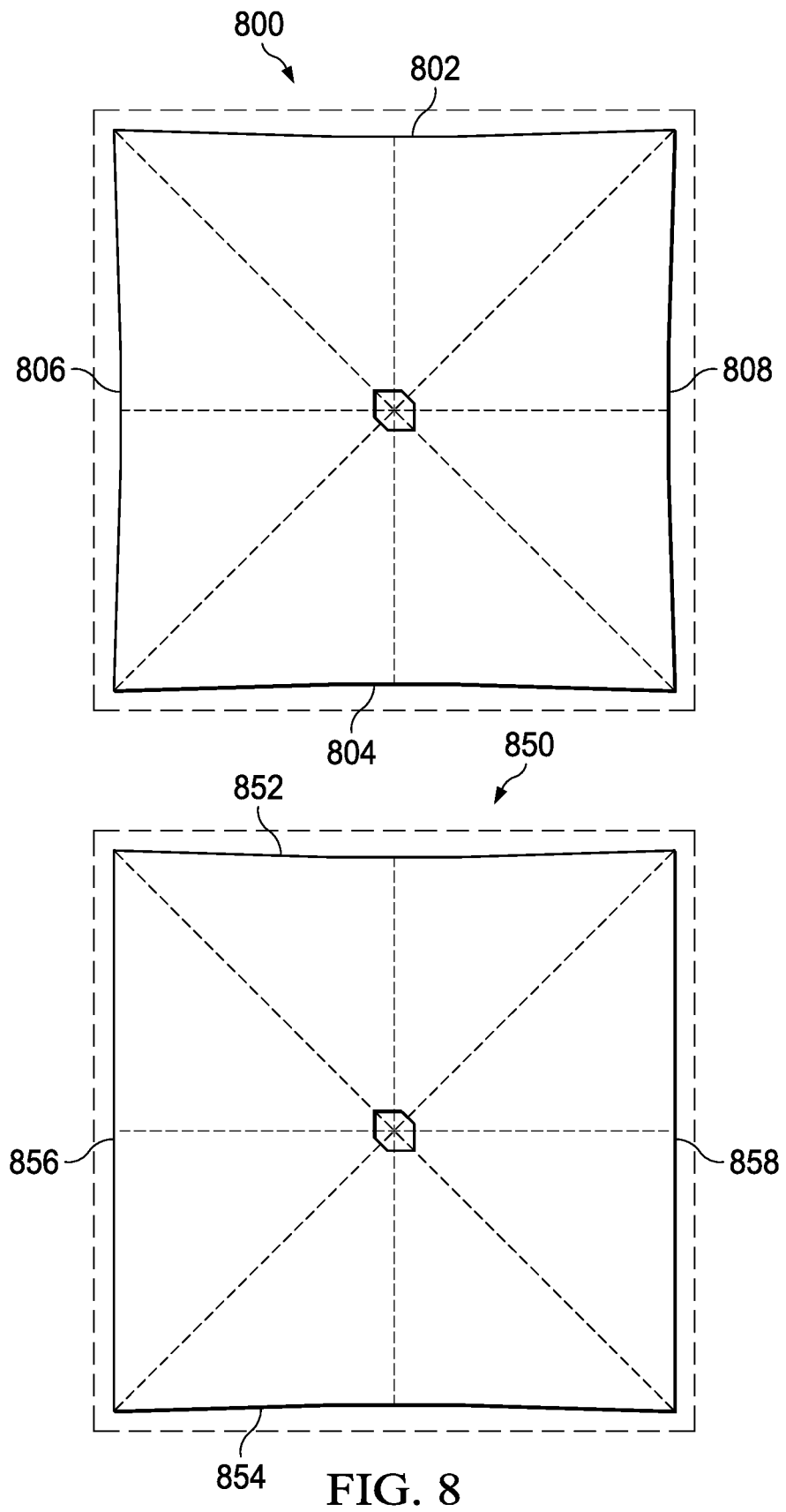
FIG. 8 is a schematic diagram of sculpted micromirrors in accordance with various examples.

FIG. 8 is a schematic diagram of sculpted micromirrors in accordance with various examples. In FIG. 8, micromirror 800 is a sculpted micromirror according to an example. Micromirror 800 is rectangular, although the edges of micromirror 800 are not perfectly straight due to the sculpting on the edges. Micromirror 800 includes a first edge 802, a second edge 804, a third edge 806, and a fourth edge 808. Each edge of micromirror 800 is a sculpted edge in this example. First edge 802 is roughly parallel to second edge 804, while third edge 806 is roughly parallel to fourth edge 808. First edge 802 and second edge 804 are roughly perpendicular to third edge 806 and fourth edge 808. Although not shown in FIG. 8, micromirror 800 is part of an array of micromirrors. In the array of micromirrors, first edge 802 is adjacent to a second adjacent micromirror and second edge 804 is adjacent to a third adjacent micromirror. Third edge 806 is adjacent to a fourth adjacent micromirror and fourth edge 808 is adjacent to a fifth adjacent micromirror.

Micromirror 850 includes a first edge 852, a second edge 854, a third edge 856, and a fourth edge 858. On micromirror 850, first edge 852 and second edge 854 are sculpted. Third edge 856 and fourth edge 858 are not sculpted. Micromirror 850 is also rectangular. First edge 852 is roughly parallel to second edge 854, while third edge 856 is roughly parallel to fourth edge 858. First edge 852 and second edge 854 are roughly perpendicular to third edge 856 and fourth edge 858. Although not shown in FIG. 8, micromirror 850 is also part of an array of micromirrors. In the array of micromirrors, first edge 852 is adjacent to a second adjacent micromirror and second edge 854 is adjacent to a third adjacent micromirror. Third edge 856 is adjacent to a fourth adjacent micromirror and fourth edge 858 is adjacent to a fifth adjacent micromirror. FIG. 8 shows the difference between a micromirror 800 with four sculpted edges and a micromirror 850 with only two sculpted edges.

Figure 9:
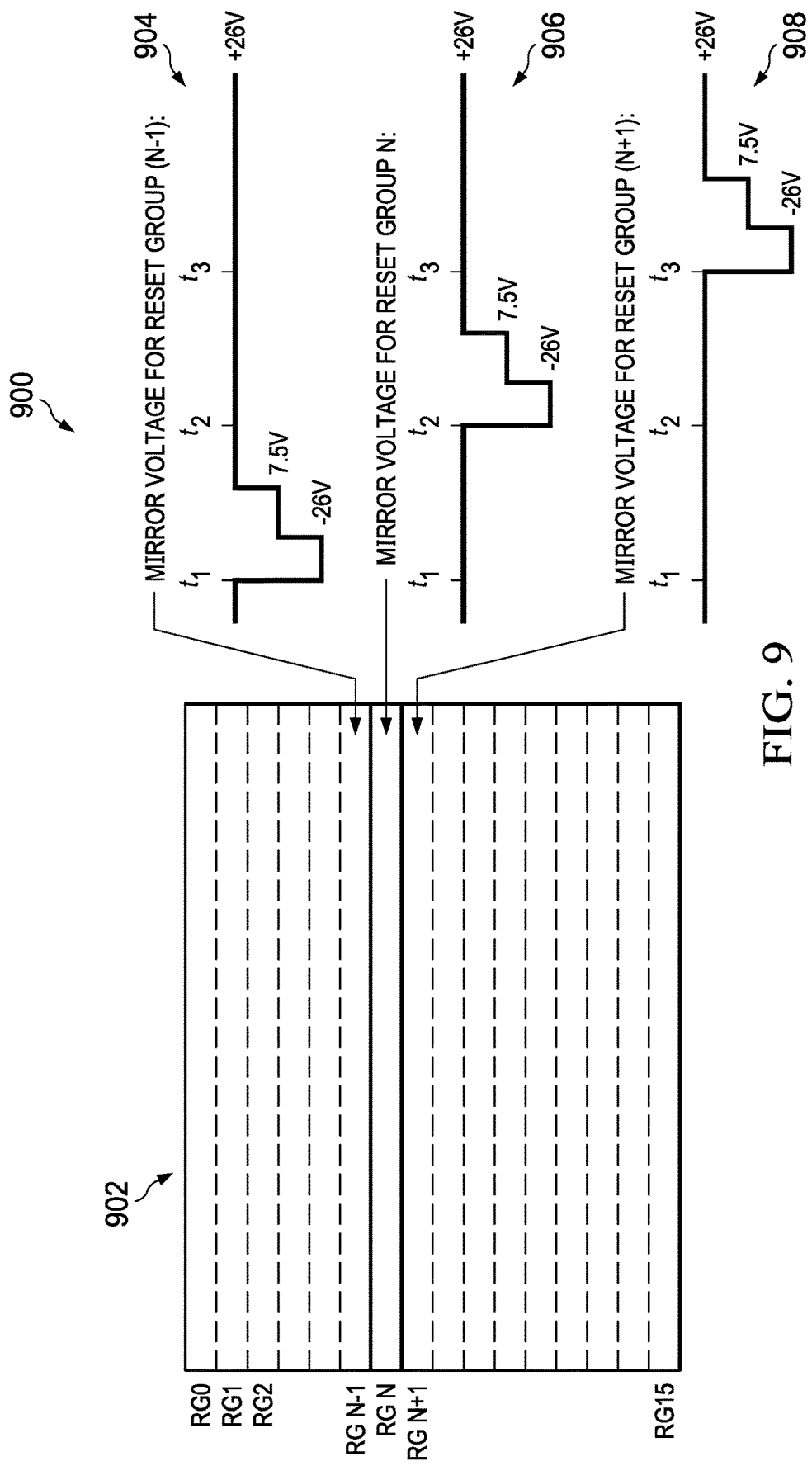
FIG. 9 is a schematic diagram of reset groups in a micromirror array in accordance with various examples.

FIG. 9 is a system 900 of reset groups in a micromirror array in accordance with various examples. Reset groups may also be referred to as blocks. A reset group is a collection of contiguous horizontal rows of micromirrors in a micromirror array. Reset groups are used to load data and reset the micromirrors in one reset group independently of other reset groups. As described above with respect to FIG. 2, data is loaded into a CMOS memory cell coupled to a specific micromirror and then the micromirror changes position with the application of the micromirror clocking pulse. With a reset group, the micromirror clocking pulse is applied to an entire reset group so the micromirrors within the reset group change position at the same time. Micromirrors in other reset groups would not change position until the micromirror clocking pulse is applied to their respective reset group. Reset groups can be operated in a phased manner by applying the micromirror clocking pulse to one reset group at a time.

System 900 includes an example micromirror array 902 that is configured into 16 horizontal reset groups labeled RG0 (reset group 0) to RG15 (reset group 15). The number of reset groups may vary in other examples. In one example, an array of 3840 by 2160 micromirror pixels includes 135 rows of pixels in each reset group (2160÷16). In another example, an array of 1024 by 768 micromirror pixels includes 48 rows of pixels in each reset group (768÷16). In system 900, three reset groups are highlighted to describe an example operation: RG N−1, RG N, and RG N+1. In the example operation, RG N is situated between RG N−1 and RG N+1.

Waveform 904 is the micromirror voltage for RG N−1. Waveform 906 is the micromirror voltage for RG N, and waveform 908 is the micromirror voltage for RG N+1. At time $t_1$, a micromirror clocking pulse of −26 V is applied to each micromirror pixel in RG N−1. At time $t_1$, the voltage at each micromirror pixel in RG N is 26 V. Therefore the bottom row of RG N−1 has a voltage of −26 V and the top row of RG N has a voltage of 26 V. These two adjacent rows have a potential difference between them of 52 V. If a first micromirror in the bottom row of RG N−1 is tilted toward a second micromirror below it in the top row of RG N, and the second micromirror is tilted toward the first micromirror, the edges of those two micromirrors will be close to one another and will exhibit a potential difference of 52 V across the gap between the edges, as shown in FIG. 1. With sculpted micromirrors, the possibility of damage is reduced across this gap by providing a larger gap between the micromirrors along certain points of the micromirror edge, as shown in FIG. 5.

Referring again to FIG. 9, waveform 906 shows that at time $t_2$ the micromirror clocking pulse of −26 V is applied to RG N. At time $t_2$, RG N−1 has a voltage of 26 V after stepping to 7.5 V between time $t_1$ and $t_2$. RG N+1 also has a voltage of 26 V at time $t_2$. Therefore a potential difference of 52 V exists between the top row of RG N and the bottom row of RG N−1, and a potential difference of 52 V also exists between the bottom row of RG N and RG N+1. As described above, sculpted micromirrors can reduce the possibility of damage to the micromirrors.

Waveform 908 shows that at time $t_3$, a micromirror clocking pulse of −26V is applied to RG N+1. At time $t_3$, RG N has a voltage of 26 V after stepping to 7.5 V between time $t_2$ and $t_3$. RG N+1 has a voltage of −26 V at time $t_3$. Therefore a potential difference of 52 V exists between the bottom row of RG N and the top row of RG N−1. Sculpted micromirrors can reduce the possibility of damage during this operating condition as well.

FIG. 9 shows that sculpted edges can be utilized for micromirrors that are in adjacent rows but situated within different reset groups. These adjacent rows may experience a potential difference of 52 V during a reset operation in some examples. If sculpted edges are only used on adjacent rows within different reset groups, but not on other rows, a viewer of the display may be able to see the block boundaries under certain viewing conditions. In one example, the block boundaries may be visible on an all white display screen because the light would be reflected differently along the sculpted edges than along the non-sculpted edges. Thus a viewer could see the 15 block boundaries as horizontal lines on the screen. In some examples, using at least two sculpted edges on each micromirror in the micromirror array provides uniformity within the array that increases image quality.

Figure 10:
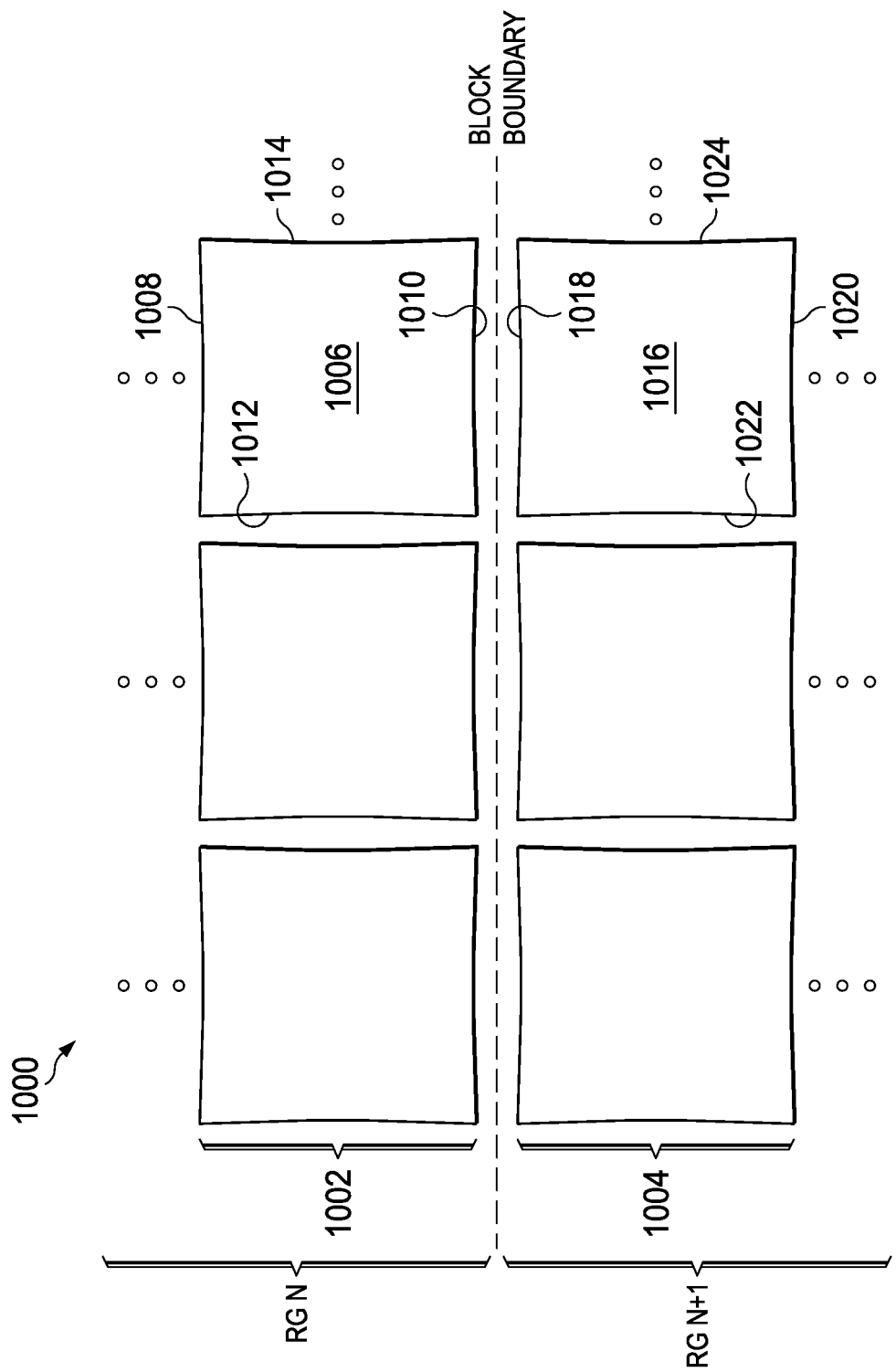
FIG. 10 is a schematic diagram of a system of sculpted micromirrors along a block boundary in accordance with various examples.

FIG. 10 is a schematic diagram of a system 1000 of sculpted micromirrors along a block boundary in accordance with various examples. System 1000 includes a first reset group RG N and a second reset group RG N+1. RG N and RG N+1 are separated by a block boundary, shown with a dashed line in FIG. 10. One row 1002 of RG N is shown, although RG N includes multiple rows in various examples. Row 1002 is along the block boundary with RG N+1. For simplicity, only three micromirrors of row 1002 are shown in FIG. 10. One row 1004 of RG N+1 is also shown, although RG N+1 includes multiple rows of micromirrors in various examples. Row 1004 is along the block boundary with RG N. Again for simplicity, only three micromirrors of row 1004 are shown in FIG. 10.

First micromirror 1006 is in row 1002 of RG N. First micromirror 1006 includes a first edge 1008, a second edge 1010, a third edge 1012, and a fourth edge 1014. In this example, first edge 1008 and second edge 1010 are sculpted edges. Third edge 1012 and fourth edge 1014 are also sculpted edges. Second edge 1010 is along the block boundary and is therefore adjacent to RG N+1. In another example, third edge 1012 and fourth edge 1014 are non-sculpted edges.

Second micromirror 1016 is in row 1004 of RG N+1. Second micromirror 1016 includes a first edge 1018, a second edge 1020, a third edge 1022, and a fourth edge 1024. In this example, first edge 1018 and second edge 1020 are sculpted edges. Third edge 1022 and fourth edge 1024 are non-sculpted edges. First edge 1018 is along the block boundary and is therefore adjacent to RG N.

In some example micromirror arrays, the left and right edges of the micromirrors (e.g., edges 1012, 1014, 1022, and 1024) have a smaller gap than the top and bottom edges due to being non-sculpted edges. This structure takes advantage of the design of a micromirror array where the array is divided into blocks. The boundaries between the blocks only occur on the top and bottom edges of the micromirrors and not on the left and right edges of the micromirrors, because the blocks extend horizontally across the micromirror array. Therefore, the large potential difference (e.g., 52 V) between the micromirrors that is caused by the micromirror clocking pulses being applied to the blocks one at a time only occurs along those top and bottom edges. The top and bottom edges benefit from being sculpted to prevent damage to the micromirrors if this large potential difference exists. The left and right edges do not experience the large potential difference between the adjacent micromirrors and therefore sculpting those edges is not as useful in some examples. Utilizing a smaller gap between the left and right edges also results in a higher fill factor than examples where all four edges of each micromirror are sculpted. A higher fill factor can create higher optical quality in some examples.

For example, during operation, first micromirror 1006 may be tilted towards its bottom left corner, and thus towards second micromirror 1016. Also, second micromirror 1016 may be tilted towards its top right corner, and thus towards first micromirror 1006. If these two micromirrors 1006, 1016 are tilted towards one another in this manner, portions of second edge 1010 and the edge that it is facing, first edge 1018, will be close to one another. FIG. 1 is an example of micromirrors tilted towards one another. In FIG. 10, second edge 1010 of first micromirror 1006 will be close to first edge 1018 of second micromirror 1016.

If the reset groups in system 1000 receive micromirror clocking pulses in a phased manner, the micromirrors in RG N may be at a different potential than the micromirrors in RG N+1. For example, if RG N receives a micromirror clocking pulse, the voltage at first micromirror 1006 will be −26 V. At that time, RG N+1 is not receiving a micromirror clocking pulse, and the voltage at second micromirror 1016 is 26 V. Therefore, the voltage difference between second edge 1010 of first micromirror 1006 and first edge 1018 of second micromirror 1016 is 52 V. Because these two edges 1010, 1018 are sculpted edges, a larger gap exists between these two edges 1010, 1018 where the edges would conventionally be nearest to one another (e.g., at the center of the edges). This larger gap helps to prevent damage to the micromirrors if the potential difference of 52 V exists between the micromirrors. In one example, the micromirrors at the boundaries between reset groups can have sculpted edges while other micromirrors do not have sculpted edges. In another example, some or all of the micromirrors that are not at the boundaries may also be sculpted.

The edges of first micromirror 1006 and second micromirror 1016 can be sculpted in any appropriate manner according to the examples herein. Micromirrors with a pixel pitch of 7.56 μm can be sculpted similarly to micromirror 602 in FIG. 6. Micromirrors with a pixel pitch of 13.68 μm can be sculpted similarly to micromirror 702 in FIG. 7. Micromirrors with other pixel pitches can be sculpted in a manner that is scaled similarly to FIGS. 6 and 7. Other sculpting geometry is useful in other examples. For example, the lengths of the straight sections and tapered sections of the sculpted edge (see, e.g., sections 608, 610, and 612 in FIG. 6) can vary in other examples. The ratio of the length of the straight section to the tapered sections can vary in other examples. The tapered sections can be different lengths in other examples. The value of the taper angle can vary in other examples. In an example, sculpting can include tapered sections without a straight section between the tapered sections. In another example, the sculpting can be a curved, concave shape instead of a more linear shape. As described above with respect to FIG. 6, the taper angle and the lengths of the various sculpted sections may vary. Other examples may have more than three sections along a sculpted edge, with the various sections sculpted at different angles.

Figure 11:
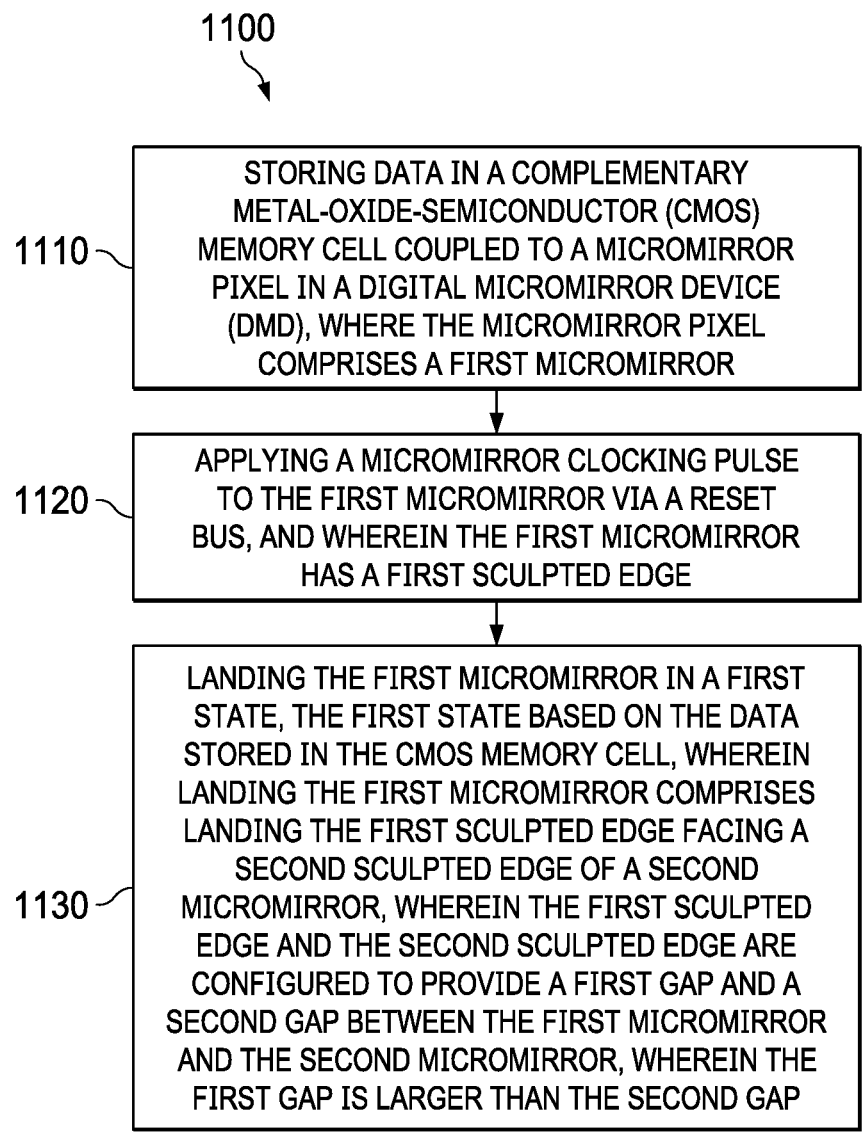
FIG. 11 is a flowchart of a method for operating sculpted micromirrors in a digital micromirror device in accordance with various examples.

FIG. 11 is a flowchart of an example method for operating sculpted micromirrors in a digital micromirror device in accordance with various examples. Although the method steps are described in conjunction with FIGS. 1-10, any system configured to perform the method steps, in any suitable order, falls within the scope of this description.

Method 1100 begins at step 1110, where a controller or other appropriate component stores data in a CMOS memory cell coupled to a micromirror pixel in a DMD. The micromirror pixel includes a first micromirror. A CMOS memory cell such as CMOS memory cell 218 in FIG. 2 is loaded in one example. In an example, CMOS memory cell 218 can be loaded with a (1,0) to indicate an "on" state for the micromirror or a (0,1) to indicate an "off" state for the micromirror. The controller can load any number of CMOS memory cells in this step.

Method 1100 continues at step 1120, where the controller applies a micromirror clocking pulse to the first micromirror via a reset bus. A reset bus such as reset bus 214 in FIG. 2 applies the micromirror clocking pulse in an example. The first micromirror has a first sculpted edge. In addition, the micromirrors can be divided into any appropriate number of reset groups, and the micromirror clocking pulses can be applied in phases to each reset group. In an example, the sculpted edge can be similar to any of the sculpted edges shown in FIGS. 5-8.

Method 1100 continues at step 1130, where the first micromirror is landed in a first state, the first state based on the data stored in the CMOS memory cell, where landing the first micromirror includes landing the first sculpted edge facing a second sculpted edge of a second micromirror. The first sculpted edge and the second sculpted edge are configured to provide a first gap and a second gap between the first micromirror and the second micromirror, where the first gap is larger than the second gap. In addition, the first gap is configured to prevent the first sculpted edge from contacting the second sculpted edge due to a potential difference caused by the micromirror clocking pulse. If the first micromirror is landed in a position such that the first sculpted edge is close to the second sculpted edge of the second micromirror, the sculpting of the edges creates a first gap that is large enough to prevent damage to the micromirrors caused by the potential difference between the adjacent micromirrors. For example, FIGS. 5 and 10 show sculpted edges on adjacent micromirrors that create a first gap as described above.

In one example, the first micromirror is in a first reset group and the second micromirror is in a second reset group. If the first and second micromirrors are in different reset groups, a potential difference of 52 V may exist between the first and second micromirrors during a micromirror clocking pulse. The sculpted edges help to prevent the first and second micromirrors from contacting one another if the 52 V potential difference exists.

In another example, the first gap occurs near a center of the first sculpted edge, and the second gap occurs near an end of the first sculpted edge. FIGS. 5-7 show the different-sized gaps along an edge of a micromirror.

In another example, the first sculpted edge includes a tapered section at each end of the first sculpted edge and a straight section near a center of the first sculpted edge, where the straight section is perpendicular to a third edge and a fourth edge of the first micromirror. FIGS. 6 and 7 show tapered sections and straight sections of sculpted edges. In one example, each tapered section is tapered at an angle of approximately 1.5 degrees.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement.

Unless otherwise stated, "about," "approximately," or "substantially" preceding a value means +/−10 percent of the stated value. Modifications are possible in the described examples, and other examples are possible, within the scope of the claims.

What is claimed is:

1. A system, comprising:
    a digital micromirror device (DMD) comprising an array of micromirror pixels comprising a first micromirror pixel and a second micromirror pixel, the first micromirror pixel comprising:
        a hinge, wherein the hinge is configured to tilt toward a first raised address electrode and toward a second raised address electrode; and
        a first micromirror coupled to the hinge, wherein the first micromirror has a sculpted edge; and
    the second micromirror pixel comprising a second micromirror, wherein a first gap between the sculpted edge and the second micromirror is larger than a second gap between the sculpted edge and the second micromirror while the first micromirror is in a flat state and the second micromirror is in a flat state.

2. The system of claim 1, wherein the sculpted edge is a first sculpted edge, and wherein a second sculpted edge of the first micromirror is opposite and parallel to the first sculpted edge.

3. The system of claim 2, wherein the first micromirror has a third edge and a fourth edge that are each perpendicular to the first sculpted edge and the second sculpted edge, wherein the third edge has a first uniform gap between the third edge and a fourth micromirror, and wherein the fourth edge has a second uniform gap between the fourth edge and a fifth micromirror.

4. The system of claim 2, wherein the first micromirror includes a third edge and a fourth edge perpendicular to the first sculpted edge and the second sculpted edge, and wherein the third edge and the fourth edge are sculpted.

5. The system of claim 1, wherein the sculpted edge includes a tapered section at each end of the sculpted edge and a straight section at a center of the sculpted edge, wherein the straight section is perpendicular to a third edge and a fourth edge of the first micromirror.

6. The system of claim 5, wherein each tapered section is tapered at an angle between approximately 0.5 and 4.0 degrees.

7. The system of claim 1, wherein the sculpted edge is a first sculpted edge, and wherein the second micromirror has a second sculpted edge, wherein the first sculpted edge and the second sculpted edge are adjacent.

8. The system of claim 1, wherein the first micromirror is in a first reset group, and the second micromirror is in a second reset group.

9. The system of claim 1, wherein the first micromirror has a pixel pitch between 7.00 and 8.00 micrometers, and the first gap is between approximately 0.30 and 0.80 micrometers.

10. The system of claim 1, further comprising:
    a complementary metal-oxide-semiconductor (CMOS) memory cell coupled to a first address pad and to a second address pad;
    a first raised address electrode coupled to the first address pad, and a second raised address electrode coupled to the second address pad; and
    a reset bus coupled to the hinge.

11. A system, comprising:
    a digital micromirror device (DMD) comprising:
        an array of micromirrors comprising a first micromirror and a second micromirror, wherein the first micromirror is in a first reset group and the second micromirror is in a second reset group, wherein the first micromirror has a first sculpted edge, the second micromirror has a second sculpted edge, the first sculpted edge facing the second sculpted edge, wherein the first sculpted edge and the second sculpted edge are configured to create a first gap and a second gap between the first micromirror and the second micromirror, and wherein the first gap is larger than the second gap; and
        a reset bus, wherein the reset bus is configured to provide a micromirror clocking pulse to the first reset group.

12. The system of claim 11, wherein the first gap occurs at a center of the first sculpted edge, and the second gap occurs at an end of the first sculpted edge.

13. The system of claim 11, further comprising:
    a projection lens; and
    a light source configured to project light onto the DMD, wherein the DMD is configured to reflect the light to the projection lens.

14. The system of claim 11, wherein the first micromirror is a rectangular micromirror having four sculpted edges.

15. The system of claim 11, wherein the first sculpted edge includes a tapered section at each end of the first sculpted edge and a straight section at a center of the first sculpted edge, wherein the straight section is perpendicular to a third edge and a fourth edge of the first micromirror.

16. A method, comprising:
    storing data in a complementary metal-oxide-semiconductor (CMOS) memory cell coupled to a micromirror pixel in a digital micromirror device (DMD), where the micromirror pixel comprises a first micromirror;
    receiving a micromirror clocking pulse at the first micromirror via a reset bus, wherein the first micromirror has a first sculpted edge; and
    landing the first micromirror in a first state, the first state based on the data stored in the CMOS memory cell, wherein landing the first micromirror comprises landing the first sculpted edge facing a second sculpted edge of a second micromirror, wherein:
        the first sculpted edge and the second sculpted edge are configured to provide a first gap and a second gap between the first micromirror and the second micromirror, wherein the first gap is larger than the second gap.

17. The method of claim 16, wherein the first micromirror is in a first reset group and the second micromirror is in a second reset group.

18. The method of claim 16, wherein the first gap occurs at a center of the first sculpted edge, and the second gap occurs at an end of the first sculpted edge.

19. The method of claim 16, wherein the first sculpted edge includes a tapered section at each end of the first sculpted edge and a straight section at a center of the first sculpted edge, wherein the straight section is perpendicular to a third edge and a fourth edge of the first micromirror.

20. The method of claim 19, wherein each tapered section is tapered at an angle between 0.5 and 4.0 degrees.

\* \* \* \* \*